US008884700B2

(12) United States Patent
Mooney et al.

(10) Patent No.: US 8,884,700 B2
(45) Date of Patent: Nov. 11, 2014

(54) INTEGRATED CIRCUIT CHIP TEMPERATURE SENSOR

(71) Applicant: Raytheon Company, Waltham, MA (US)

(72) Inventors: Jon Mooney, Dallas, TX (US); Bryan G. Fast, Garland, TX (US); David D. Heston, Dallas, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/743,570

(22) Filed: Jan. 17, 2013

(65) Prior Publication Data

US 2014/0197891 A1    Jul. 17, 2014

(51) Int. Cl.
*H03F 3/04* (2006.01)
*H03F 1/30* (2006.01)

(52) U.S. Cl.
CPC ...................................... *H03F 1/30* (2013.01)
USPC .......................................... 330/289; 330/307

(58) Field of Classification Search
USPC .................. 330/289, 298, 307; 257/537, 538
See application file for complete search history.

(56) References Cited

U.S. PATENT DOCUMENTS

| 5,023,431 | A | 6/1991 | Roberge |
| 5,874,771 | A | 2/1999 | Hurkx et al. |
| 6,255,910 | B1 * | 7/2001 | Forstner ........................ 330/289 |
| 7,142,058 | B2 * | 11/2006 | Bokatius ....................... 330/289 |

FOREIGN PATENT DOCUMENTS

DE    10 2005 010 013 A1    9/2006

OTHER PUBLICATIONS

Notification of Transmittal of The International Search Report and The Written Opinion of the International Searching Authority, or the Declaration, PCT/US2013/066039, Jul. 9, 2014, 1 page.
International Search Report, PCT/US2013/066039, Jul. 9, 2014, 3 pages.
Written Opinion of the International Searching Authority, PCT/US2013/066039 Jul. 9, 2014, 4 pages.

* cited by examiner

*Primary Examiner* — Steven J Mottola
(74) *Attorney, Agent, or Firm* — Daly, Crowley, Mofford & Durkee, LLP

(57) ABSTRACT

A temperature control system having: a resistor formed in a region of a semiconductor, such resistor having a pair of spaced electrodes in ohmic contact with the semiconductor; at least one device formed in another region of the semiconductor thermally proximate the resistor formed region, such device generating heat in the semiconductor; and circuitry, including a reference connected to one of the pair of electrodes, for operating the resistor in saturation and for sensing variation in the resistor in response to the heat generated by the device and for controlling the heat generated by the device in the semiconductor in response to the sensed variation.

20 Claims, 4 Drawing Sheets

INTEGRATED CIRCUIT CHIP TEMPERATURE SENSOR

TECHNICAL FIELD

This disclosure relates generally to temperatures sensors and more particularly to integrated circuit chip temperature sensors.

BACKGROUND

As is known in the art, resistors have been used for temperature sensing because their resistance value can change with temperature depending on their resistive material. As is also known, Monolithic Microwave Integrated Circuits ((MMICS) high power amplifiers (HPAs), particularly those fabricated on Gallium-Nitride semiconductor technology, have the ability to generate very large power densities. These large power densities can create thermal management problems at the system level when the amplifier is placed in a packaged environment. Having the ability to accurately sense the temperature of the HPA at the MMIC level and near the source of the heat (i.e. the transistor) is critical to managing the thermal impact of the HPA on the system performance.

SUMMARY

In accordance with the present disclosure, a temperature control system is provided having: a resistor formed in a region of a semiconductor, such resistor having a pair of spaced electrodes in ohmic contact with the semiconductor; at least one device formed in another region of the semiconductor thermally proximate the resistor formed region, such device generating heat in the semiconductor; and circuitry, including a reference connected to one of the pair of electrodes, for operating the resistor in saturation and for sensing variation in the resistor in response to the heat generated by the device and for controlling the heat generated by the device in the semiconductor in response to the sensed variation.

The inventors have recognized that when a semiconductor resistor is biased into saturation, the temperature coefficient of the resistor increases significantly compared with a semiconductor resistor biased in the linear region and therefore when the resistor is biased into saturation it provides greater sensitivity when used as a temperature sensor.

In one embodiment, the region between the pair of electrodes is doped semiconductor.

In one embodiment, the reference is a reference voltage and wherein the circuitry senses variations in current through the resistor in response to variations in the temperature of the semiconductor.

In one embodiment, the reference is a reference current and wherein the circuitry senses variations in voltage said other electrode in response to variations in the temperature of the semiconductor.

In one embodiment the device is a transistor amplifier.

In one embodiment, the resistor and device are formed on a semiconductor and wherein the circuitry is formed on a different semiconductor.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
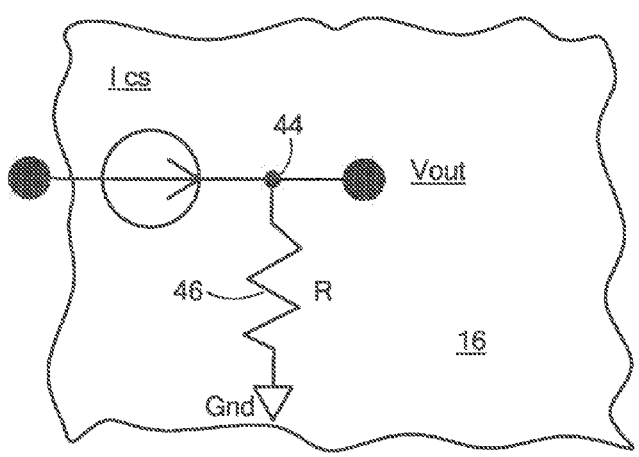
FIG. 1 is a schematic diagram of temperature sensing circuit according to the disclosure.
Figure 2:
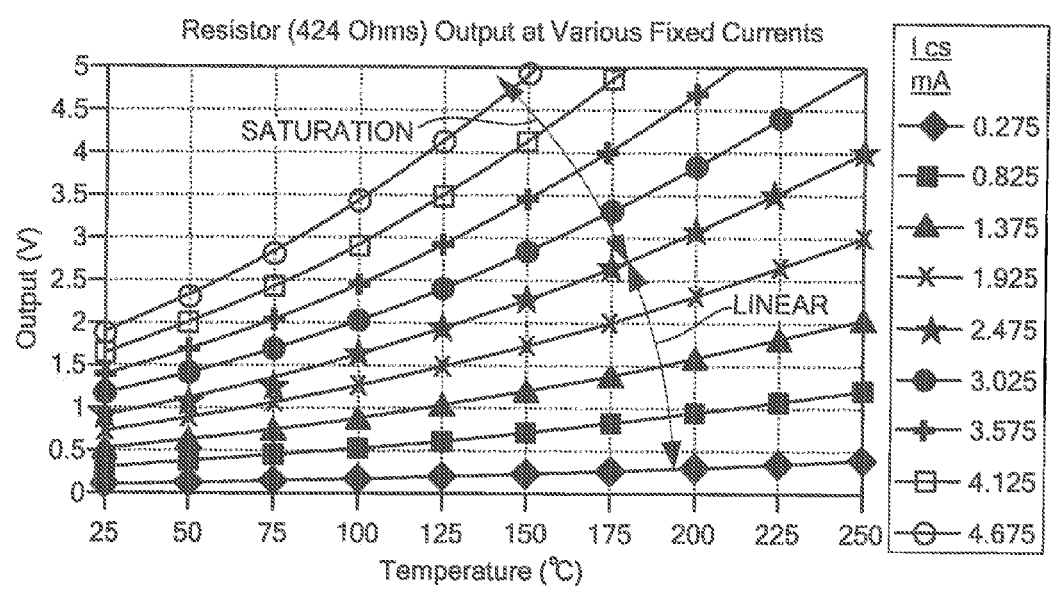
FIG. 2 is a set of curves showing the relationship output voltages of the circuit of FIG. 1 as a function of the temperature of such circuit for various levels of current passing from a constant current source of such circuit through a semiconductor resistor of such circuit both when the resistor is operating in saturation and non-saturation.

Referring now to FIG. 1, a semiconductor resistor, R, (i.e., a resistor having a pair of electrodes 44, 46 in ohmic contact with a semiconductor 16) is shown fed from a constant current source Ics. FIG. 2 shows voltage across the pair of electrodes 44, 46 as a function of the temperature of the resistor, R, for various currents Ics fed to the resistor. It is noted that the variations in output voltage (i.e., the variations in the voltage at electrode 12) with variations in the temperature of the resistor R increases as the resistor R is operated in increasing saturated regions; i.e., higher values of Ics. It is also noted that as the resistor saturates (i.e., operates with higher values of Ics) the temperature sensitivity (i.e., variation in output voltage as a function of temperature) improves (i.e., increases).

Figure 3:
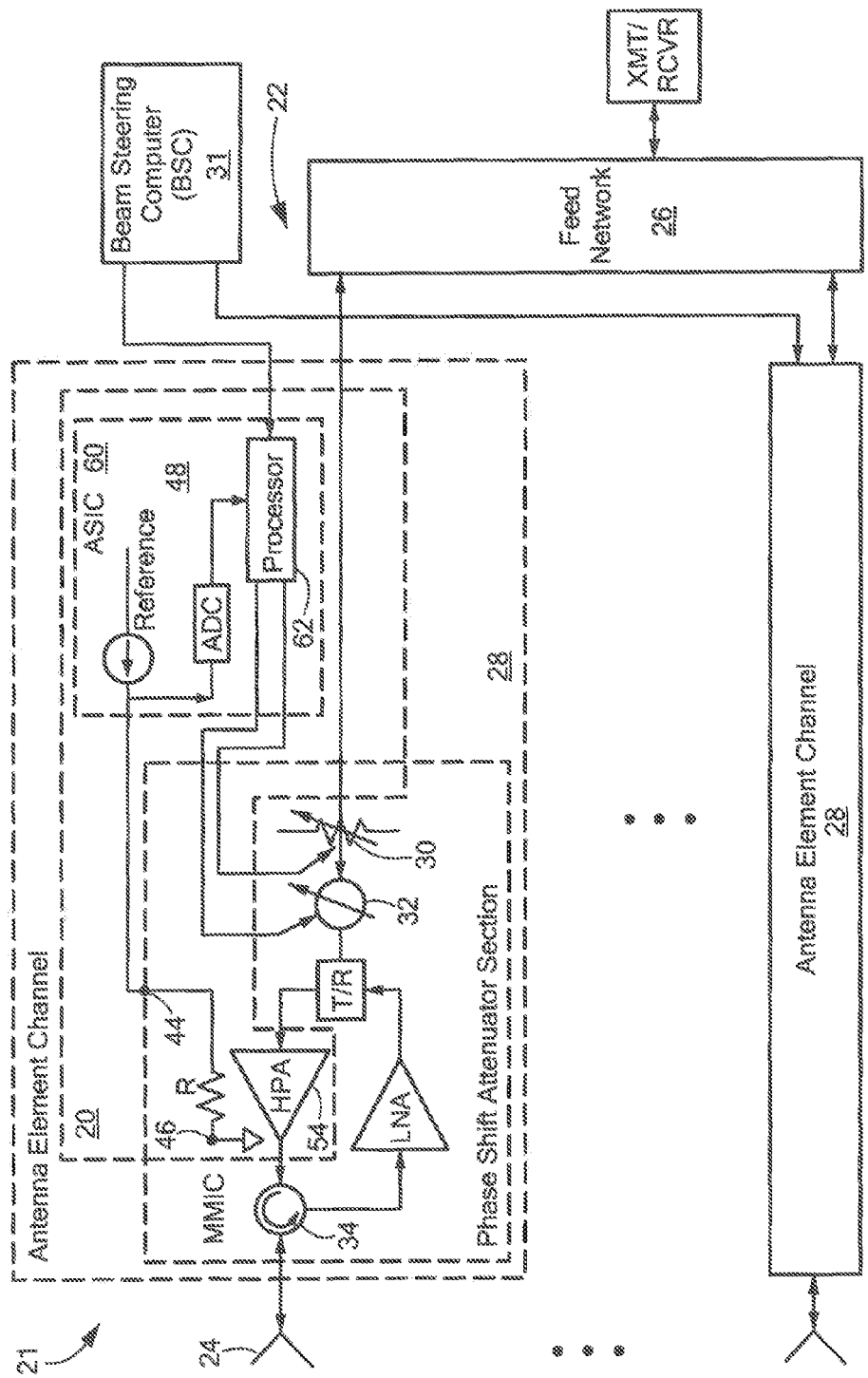
FIG. 3 is a simplified block diagram of a phased array radar system including a temperature control system according to the disclosure, such temperature control system including the circuit of FIG. 1.
Figure 4:
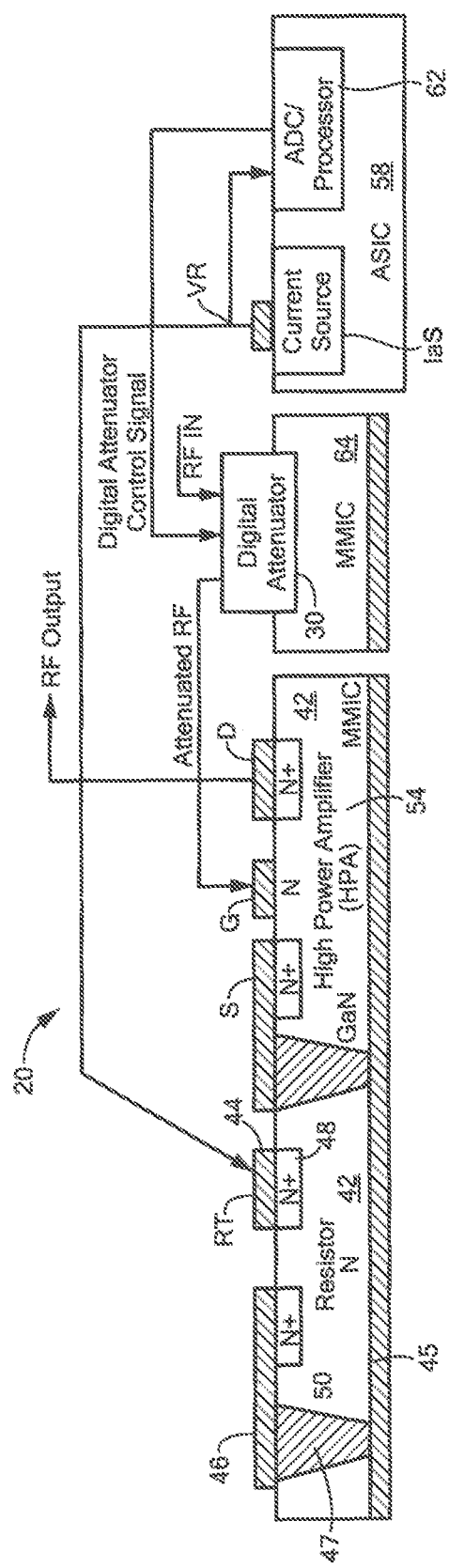
FIG. 4 is a simplified cross sectional Sketch of semiconductor chips forming an exemplary one of a plurality of variable phase shifter-variable gain channels used in the phased array radar system of FIG. 4, such variable phase shifter-variable gain channels having the temperature control system of FIG. 3.

Referring now to FIGS. 3 and 4, a temperature control system 20 is shown. Here, in this example, the temperature control system 20 is used to control the temperature of a high power amplifier (HPA) in a transmit/receive, phase shifter/attenuator channel of phased array system 21; it should be understood however that the temperature control system 20 may be used in many other applications.

Thus, here beam forming apparatus 22 (FIG. 3) is used to form beams of electromagnetic radiation. The shape of the beam is related to the phase and amplitude distributions provided to signals received or transmitted across an aperture; i.e., across antenna elements 24) of the apparatus 22. For example, in a phased array antenna, the aperture includes a plurality of antenna elements 24. Each one of the antenna elements 24 is coupled to a feed network or structure 26 through a corresponding one of a plurality of variable phase shifter-variable gain channels 28, The feed structure 26 may be a corporate feed or may be through illuminations as in a space fed phased array system. In any event, the channels are controlled by signals from a beam steering computer 31 to provide a collimated and directed beam of radiation. For example, for a broadside (i.e., boresight) beam the phase shift of the signals emanating from each antenna element 24 is zero relative to some arbitrary reference. If the phase shift from element 24 to element 24 differs by a fixed amount from zero, the direction of the main radiation lobe is shifted from broadside accordingly.

Each channel 28 includes: a digitally controlled attenuator 30; a digitally controlled phase shifter 32; a transmit/receive switch (T/R); a high power amplifier (HPA); a circulator 34 and a low noise amplifier LNA, arranged as shown. During transmit, RF energy from the transmitter section of transmit/receive section XMT/RCVR, is fed to the plurality of antenna elements 24 through the feed network 26, the digitally controlled attenuator 30, the digitally controlled phase shifter 32, the transmit/receive switch (T/R), the high power amplifier (HPA), and the circulator 34, as indicated. On receive, energy received by the antenna elements 24 is fed to the receiver section of the XMT/RCVR through the circulator 34, low noise amplifier LNA, T/R switch, phase shifter 32, attenuator 30, and feed network 26, as indicated.

Here, each channel 28 includes the temperature control system 20. More particularly, the temperature control system 20 includes: a resistor, R, formed in a region of a semiconductor 42 (FIG. 4), here, for example, a III-V semiconductor such as, for example, gallium nitride (GaN). The resistor, R, has a pair of spaced electrode 44, 46 in ohmic contact with doped regions 48, 50, respectively here for example N+ doped regions of here, for example, N doped semiconductor 42. Here, in this example, electrode 44 is connected to a constant current source Ics and electrode 46 is connected to ground 45 through a via 47.

Also formed in the semiconductor 42, in close proximate to the resistor R, is at least one device 54; here for example, a GAN transistor used for the HPA. The temperature control system 20 also includes circuitry 56, here, for example, formed on another semiconductor 58 (FIG. 3) as part of an ASIC 60. Here, for example, the semiconductor 58 is silicon. The circuitry 20 includes a reference, here the constant current source Ics, connected to one of the pair of electrodes, here electrode 44, for operating the resistor R in saturation and for sensing variation in the voltage at electrode 44 in response to the heat generated by the device 54 and for controlling the heat generated by the device 54 in the semiconductor 42 in response to the sensed voltage variation at electrode 44.

Here, the voltage at electrode 44 is fed to the ASIC 60 where it is converted into a corresponding digital signal by an analog to digital converter (ADC). The digital signal is fed to a processor 62 of the ASIC 60. In one implementation, for example, the processor 62 has stored therein, as for example in a Read Only Memory (ROM), not shown, the relationship between the voltage and temperature from the data in FIG. 2. A predetermined reference or desired temperature for the semiconductor 42 is also stored in the ROM. The processor 62 produces a temperature adjusting control signal representative of the difference between the actual temperature of the semiconductor and the desired temperature. The processor 62 also produces beam steering control signal from the beam steering computer 31. The processor 62 modifies the beam steering control signal by the temperature adjusting control signal to produce a combined control signal for the phase shifter 32 and the variable, digitally controlled attenuator 30. The phase shifter 32 and the variable, digitally controlled attenuator 30 are here formed, in this example, on a third semiconductor 64, here also a III-V semiconductor. This third semiconductor 64 has fed to it a radio frequency (RF) signal to be amplified by the HPA after passing through the digitally controlled attenuator 30. Thus here, in this example, the level of the RF input to the HPA is varied in accordance with variations in the temperature sensed by the resistor R. More particularly, in the example, as the temperature proximate the HPA increase, such increase in temperature is sensed by the resistor R and the voltage increase at electrode 44 is fed to the processor 62 resulting in the processor 62 sending as the combined control signal to attenuator 60 to increase the attenuation a small amount in addition to the attenuation required by the beam steering computer 31 and thereby reduce the RF input to the HPA. This reduced RF input result in a corresponding reduction in the heat generated temperature generated by the HPA. The effect then is to provide a feedback, temperature control system. It should be understood that this is an example of the operation of the processor 62 in modifying the beam steering control signal. Other implementations may be used. For example, the output of the ADC may be directly compared with a stored digital word representative of the desired temperature of the semiconductor 42 without storing in the ROM the data from the curve in FIG. 2.

Figure 5:
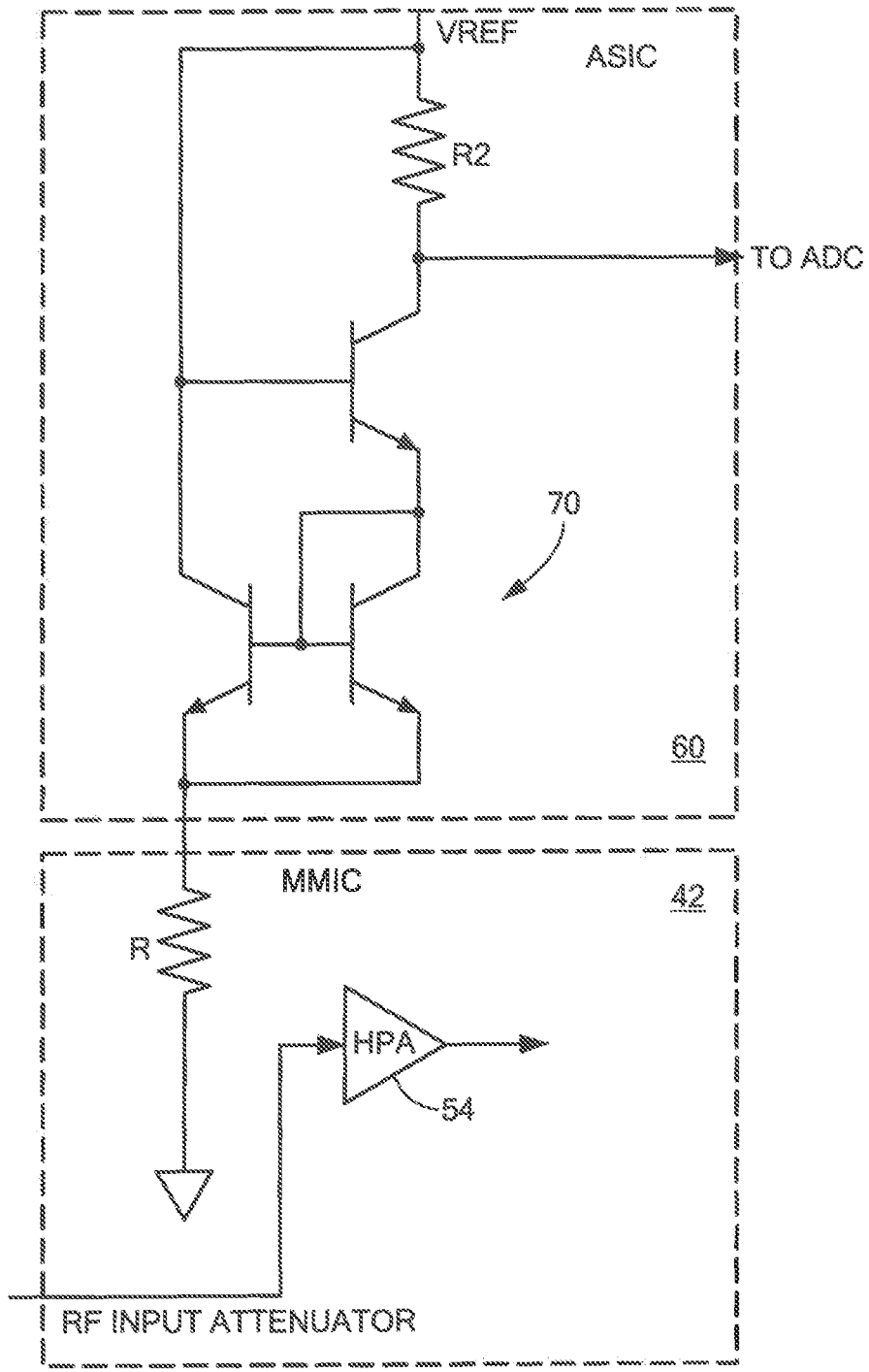
FIG. 5 is a simplified schematic diagram of an alternative embodiment of the temperature control system according to the disclosure.

A number of embodiments of the disclosure have been described. Nevertheless, it will be understood that various modifications may be made without departing from the spirit and scope of the disclosure. For example, the resistor R on the semiconductor 42 may be fed with a reference voltage on the ASIC 60, as shown in FIG. 5. The ASIC 60 includes a current mirror 70 such as a Wilson current mirror, here formed by bipolar transistors but FETs may be used. The current mirror 70 produces a voltage across a resistor R2 on the ASIC 60 proportional to the current through the resistor R on the semiconductor 42. Thus, variations in the semiconductor caused by heating of the HPA are sensed by the resistor R, as described above, and such variations cause a corresponding change in the current through the resistor R. The current through resistor R is mirrored by the current mirror into corresponding changes in the current through resistor R2 and hence produce corresponding changes in the voltage across the resistor R2. The voltage across R2 is converted into digital signals by the ADC for the processor 62 as described above. Thus, current changes through the resistor R produce corresponding changes through R2 and hence in the voltage produced by the ADC. Accordingly, other embodiments are within the scope of the following claims.

What is claimed is:

1. A temperature control system, comprising:
   a semiconductor;
   a resistor formed in a region of the semiconductor, such resistor having a pair of spaced electrodes in ohmic contact with the semiconductor;
   at least one device formed in another region of the semiconductor thermally proximate the resistor formed region, such device generating heat in the semiconductor;
   circuitry, including a reference connected to one of the pair of electrodes, for operating the resistor in saturation and for sensing variation in the resistor in response to the heat generated by the device and for controlling the heat generated by the device in the semiconductor in response to the sensed variation.

2. The temperature control circuitry recited in claim 1 wherein the region between the pair of electrodes is doped semiconductor.

3. The temperature control circuitry recited in claim 1 wherein the reference is a reference voltage and wherein the circuitry senses variations in current through the resistor in response to variations in the temperature of the semiconductor.

4. The temperature control circuitry recited in claim 1 wherein the reference is a reference current and wherein the circuitry senses variations in voltage at said one of the electrodes in response to variations in the temperature of the semiconductor.

5. The temperature control circuitry recited in claim 1 wherein the device is a transistor amplifier.

6. The temperature control circuitry recited in claim 3 wherein the region between the pair of electrodes is doped semiconductor.

7. The temperature control circuitry recited in claim 4 wherein the region between the pair of electrodes is doped semiconductor.

8. The temperature control circuitry recited in claim 5 wherein the region between the pair of electrodes is doped semiconductor.

9. A temperature control system, comprising:
a semiconductor;
   a resistor formed in a region of the semiconductor, such resistor having a pair of spaced electrodes in ohmic contact with the semiconductor;
   a transistor formed in another region of the semiconductor thermally proximate the resistor formed region, such transistor generating heat in the semiconductor;
circuitry coupled to the pair of electrodes, for operating the resistor in saturation and for sensing variation in current through, or voltage between, the pair of spaced electrodes of the saturation operated resistor and for controlling the temperature of the semiconductor in response to the sensed variation.

10. The temperature control circuitry recited in claim 3 wherein 1 the region between the pair of electrodes is doped semiconductor.

11. The temperature control circuitry recited in claim 9 wherein the reference is a reference voltage and wherein the circuitry senses variations in current through the resistor in response to variations in the temperature of the semiconductor.

12. The temperature control circuitry recited in claim 9 wherein the reference is a reference current and wherein the circuitry senses variations in voltage at one of the electrodes in response to variations in the temperature of the semiconductor.

13. The temperature control circuitry recited in claim 9 wherein the transistor is arranged as an amplifier.

14. The temperature control circuitry recited in claim 11 wherein the region between the pair of electrodes is doped semiconductor.

15. The temperature control circuitry recited in claim 12 wherein the region between the pair of electrodes is doped semiconductor.

16. The temperature control circuitry recited in claim 13 wherein the region between the pair of electrodes is doped semiconductor.

17. The temperature control circuitry recited in claim 1 wherein the resistor and device are formed on a III-V semiconductor and wherein the circuitry is formed on a different semiconductor.

18. The temperature control circuitry recited in claim 9 wherein the resistor and transistor are formed on a III-V semiconductor and wherein the circuitry is formed on a different semiconductor.

19. The temperature control circuitry recited in claim 17 wherein the region between the pair of electrodes is doped semiconductor.

20. The temperature control circuitry recited in claim 18 wherein the region between the pair of electrodes is doped semiconductor.

* * * * *